(12) United States Patent
Yang et al.

(10) Patent No.: US 11,513,438 B2
(45) Date of Patent: Nov. 29, 2022

(54) PROCESS FOR PLASMONIC-BASED HIGH RESOLUTION COLOR PRINTING

(71) Applicant: AGENCY FOR SCIENCE, TECHNOLOGY AND RESEARCH, Singapore (SG)

(72) Inventors: Joel Kwang Wei Yang, Singapore (SG); Xiao Ming Goh, Singapore (SG); Di Zhu, Singapore (SG); Shawn Tan, Singapore (SG); Ying Min Wang, Singapore (SG); Zhaogang Dong, Singapore (SG)

(73) Assignee: AGENCY FOR SCIENCE, TECHNOLOGY AND RESEARCH, Singapore (SG)

(*) Notice: Subject to any disclaimer, the term of this patent is extended or adjusted under 35 U.S.C. 154(b) by 0 days.

(21) Appl. No.: 17/061,263

(22) Filed: Oct. 1, 2020

(65) Prior Publication Data

US 2021/0018834 A1 Jan. 21, 2021

Related U.S. Application Data

(62) Division of application No. 15/304,848, filed as application No. PCT/SG2015/050071 on Apr. 14, 2015, now Pat. No. 10,831,097.

(30) Foreign Application Priority Data

Apr. 17, 2014 (SG) .......................... 10201401610R

(51) Int. Cl.
*G03F 7/00* (2006.01)
*H04N 1/32* (2006.01)
(Continued)

(52) U.S. Cl.
CPC .......... *G03F 7/0002* (2013.01); *G02B 5/008* (2013.01); *G02B 5/1809* (2013.01); *G02B 5/204* (2013.01);
(Continued)

(58) Field of Classification Search
CPC ...................................................... G02B 5/008
See application file for complete search history.

(56) References Cited

U.S. PATENT DOCUMENTS

2006/0273245 A1* 12/2006 Kim ...................... G01J 3/0259
250/226
2013/0327928 A1* 12/2013 Leach ................... G01J 1/0407
156/280

FOREIGN PATENT DOCUMENTS

EP 2653903 A1 * 10/2013 ........... G02B 21/004
EP 2653903 A1 10/2013
WO 2013039454 A1 3/2013

OTHER PUBLICATIONS

The International Search Report and Written Opinion of the International Patent Application No. PCT/SG2015/050071 dated May 18, 2015, 9 pages.
(Continued)

*Primary Examiner* — Alex A Rolland
(74) *Attorney, Agent, or Firm* — Womble Bond Dickinson (US) LLP

(57) ABSTRACT

A process for plasmonic-based high resolution color printing is provided. The process includes a) providing a nanostructured substrate surface having a reverse structure geometry comprised of nanopits and nanoposts on a support, and b) forming a conformal continuous metal coating over the nanostructured substrate surface to generate a continuous metal film, the continuous metal film defining nanostructures for the plasmonic-based high resolution color printing, wherein a periodicity of the nanostructures is equal to or less
(Continued)

than a diffraction limit of visible light. A nanostructured metal film or metal-film coated support obtained by the process and a method for generating a color image are also provided.

14 Claims, 8 Drawing Sheets

(51) Int. Cl.
*G02B 5/26* (2006.01)
*G02B 5/20* (2006.01)
*G02B 5/00* (2006.01)
*G02B 5/18* (2006.01)
*G03F 7/16* (2006.01)
*B82Y 30/00* (2011.01)
*B82Y 20/00* (2011.01)
*G02B 6/122* (2006.01)

(52) U.S. Cl.
CPC ............. *G02B 5/26* (2013.01); *G03F 7/0012* (2013.01); *G03F 7/167* (2013.01); *H04N 1/32144* (2013.01); *B82Y 20/00* (2013.01); *B82Y 30/00* (2013.01); *G02B 6/1226* (2013.01)

(56) References Cited

OTHER PUBLICATIONS

The International Preliminary Report on Patentability of the International Patent Application No. PCT/SG2015/050071 dated Oct. 27, 2016, 6 pages.
Lumerical Solutions, Inc., "FDTD Solutions," Lumerical's Nanophotonic FDTD Simulation Software, retrieved from the Internet: https://www.lumerical.com/tcad-products/fdtd/, 5 pgs., (2003-2017).
D.Y. Smith, et al., "The Optical Properties of Metallic Aluminum," Handbook of Optical Constants of Solids, Edited by Edward D. Palik, pp. 369-406, 1985.

* cited by examiner (A)

(B)

(A)

(B)

(C)

(D)

(E)

PROCESS FOR PLASMONIC-BASED HIGH RESOLUTION COLOR PRINTING

CROSS-REFERENCE TO RELATED APPLICATIONS

This patent application is a divisional of U.S. patent application Ser. No. 15/304,848, filed Oct. 17, 2016, entitled PROCESS FOR PLASMONIC-BASED HIGH RESOLUTION COLOR PRINTING, which is a U.S. National Phase Application under 35 U.S.C. § 371 of International Application No. PCT/SG2015/050071, filed on 14 Apr. 2015, entitled PROCESS FOR PLASMONIC-BASED HIGH RESOLUTION COLOR PRINTING, which claims the benefit of priority of Singapore Patent Application No. 10201401610R, filed on 17 Apr. 2014, the content of which was incorporated herein by reference in its entirety for all purposes.

TECHNICAL FIELD

Various embodiments relate to a process for plasmonic-based high resolution color printing, a nanostructured metal film or metal-film coated support obtained by the process, and a method for generating a color image.

BACKGROUND

The landscape of color printing technologies is currently dominated by colorant pigmentation methods involving production of a range of different colors by overlaying primary color dyes in different proportions onto a substrate to create a full color print. While such pigment-based approaches constitute the current industry standard, resolution of the printed image is constrained by spot size of the dye droplets—typically in the micro-sized range. Further limitations include color bleeding between adjacent droplets, and fading of color pigments resulting from breakdown of molecules when exposed to UV radiation or intense heat. These fundamentally limit the resolution and durability of pigment-based printing technologies.

Approaches for fabricating high-resolution color prints where color creation is achieved through excitation of plasmonic resonances in metal nanostructures have been developed. They present several unique advantages over conventional pigment-based printing technologies, such as (1) vibrant color prints at the ultimate resolution of the optical diffraction limit; (2) multicolor palette from a single metal evaporation step on a nanostructured substrate; and (3) broad spectrum of colors determined by nanostructure design, thereby eliminating undesirable effects of color bleeding associated with pigment-based printing technologies.

Notwithstanding the above, most of the plasmonic-based printing methods are based on transmitted light, thereby limiting their application to transparent substrates. They may also require special illumination techniques, and/or specific viewing angles to view the prints.

One of the plasmonic-based printing methods developed involves depositing layers of metal on arrays of hydrogen silsesquioxane nanoposts to form isolated plasmonic nanodisks. Formation of the isolated plasmonic nanodisks requires height of the nanoposts to be much larger than thickness of the metal layers. The nanodisks are elevated above equally sized holes formed on a backreflector which functions as a mirror to increase scattering intensity of the nanodisks. Interaction of the nanodisks with the backreflector thus results in extinction of specific wavelengths in the visible range, seen as colors reflected off the nanodisks which may be observed in an optical microscope. The isolated plasmonic nanodisks exhibit distinct resonances which induce extinction of specific wavelengths in the visible spectra, and manifest as colors reflected off the nanodisks that may be observed in an optical microscope.

This method, however, involves more steps in the fabrication process given the composite structure which typically includes a metal and a dielectric. Use of thin metal layers of about 20 nm in these plasmonic pixels also implies the need for fine control of the metal thickness during the metallisation process. In particular, the method may require use of expensive equipment and special processing conditions, such as electron beam evaporation in a vacuum chamber, so as to allow directional line-of-sight deposition for forming the isolated metal nanostructures, while leaving vertical sidewalls of the nanoposts uncoated.

The isolated metal nanostructures were deemed necessary for generation of plasmonic colors. Conventional metal deposition methods such as direct metal deposition (DMD), spray deposition, and conformal metal deposition, cannot be used since they create continuous metal films and are not able to generate the isolated metal nanostructures. This presents a steep barrier of entry for commercial use. There were also no architectures that may be used to generate plasmonic colors which are compatible with the conventional metal deposition methods.

In view of the above, there exists a need for an improved method for plasmonic-based high resolution color printing that overcomes or at least alleviates one or more of the above-mentioned problems.

SUMMARY

In a first aspect, a process for plasmonic-based high resolution color printing is provided. The process comprises
a) providing a nanostructured substrate surface having a reverse structure geometry comprised of nanopits and nanoposts on a support, and
b) forming a conformal continuous metal coating over the nanostructured substrate surface to generate a continuous metal film, the continuous metal film defining nanostructures for the plasmonic-based high resolution color printing, wherein a periodicity of the nanostructures is equal to or less than a diffraction limit of visible light.

In a second aspect, a nanostructured metal film or metal-film coated support obtained by a process according to the first aspect is provided.

In a third aspect, a method for generating a color image is provided. The method comprises irradiating a nanostructured metal film or metal-film coated support obtained by a process according to the first aspect with visible light.

In a fourth aspect, use of a method according to the third aspect in security tagging, anti-counterfeiting, display, and/or data-storage is provided.

BRIEF DESCRIPTION OF THE DRAWINGS

The invention will be better understood with reference to the detailed description when considered in conjunction with the non-limiting examples and the accompanying drawings, in which.

DETAILED DESCRIPTION

Figure 1:
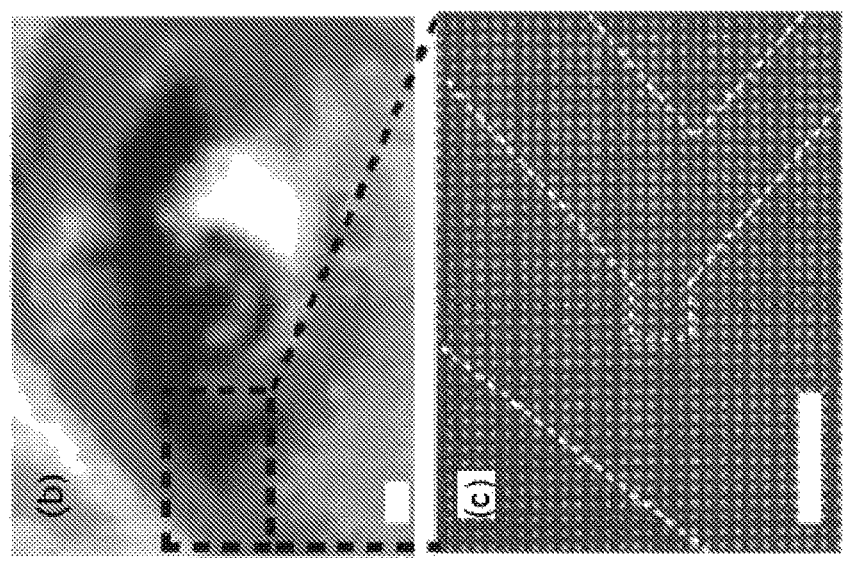
FIG. 1 depicts state of the art nanostructures for plasmonic color printing, where (a) is a schematic diagram of nanopost arrays forming 'plasmonic pixels'; (b) is an optical microscope image of a section of a color print formed using 'plasmonic pixels'. Insert of (b) is shown in (c), which is a scanning electron microscopy (SEM) image of section indicated within the dotted black box. Scale bars: (b) and (c) 500 nm.
Figure 1:
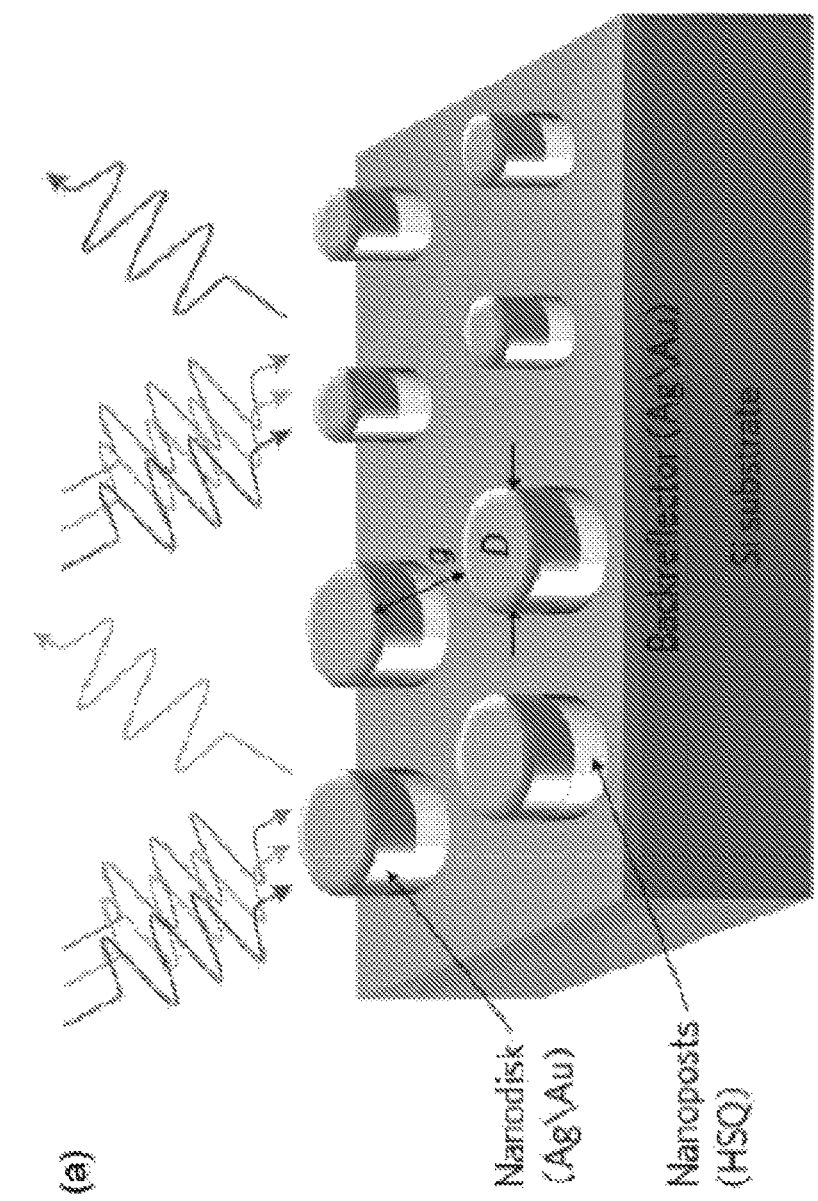
Figure 2:
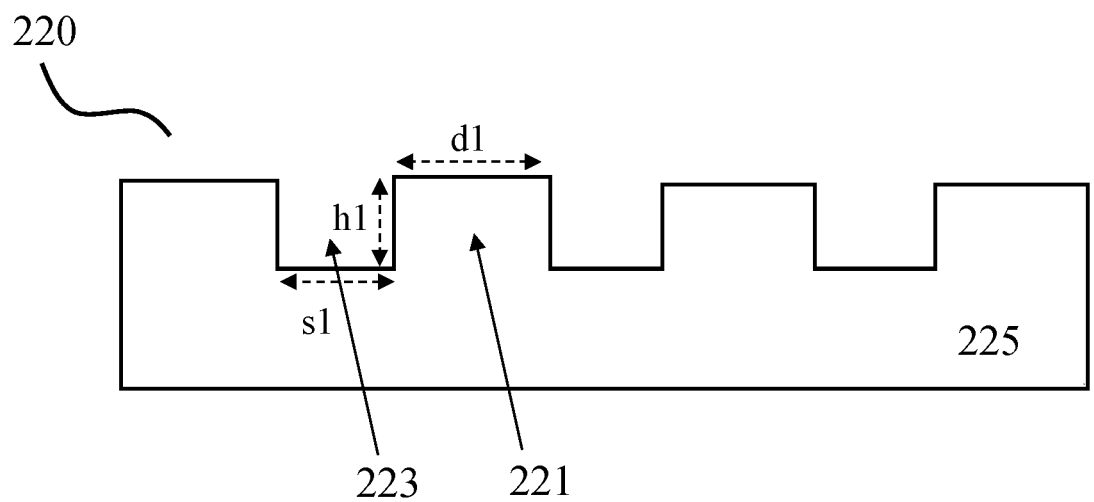
FIG. 2 shows (A) a cross-sectional view of a nanostructured substrate surface 220 having a reverse structure geometry comprised of nanopits 223 and nanoposts 221 on a support 225. s1 denotes distance between adjacent nanoposts 221; d1 denotes a cross sectional dimension of nanopost 221; and h1 denotes height of nanopost 221. Height of nanopost 221, h1, corresponds to depth of adjacent nanopit 223. In (B), besides nanostructured substrate surface 220, a cross-sectional view of a continuous metal film 240 defining nanostructures for the plasmonic-based high resolution color printing is additionally shown. In the embodiment shown, a conformal continuous metal coating 245 is formed over the nanostructured substrate surface 220, with subsequent separation from the nanostructured substrate surface 220. The conformal continuous metal coating 245 fills the nanopits 223 of the nanostructured substrate surface 220 to result in formation of nanoposts 241 on the continuous metal film 240, while nanoposts 221 of the nanostructured substrate surface 220 translate into nanopits 243 on the continuous metal film 240. d2 denotes a cross sectional dimension of nanopost 241 on the continuous metal film 240, and may have a length corresponding to s1; s2 denotes distance between adjacent nanoposts 241 on the continuous metal film 240, and may have a length corresponding to d1; h2 denotes height of nanopost 241 on the continuous metal film 240, and corresponds to depth of adjacent nanopit 243. h2 may have a length corresponding to h1.
Figure 2:
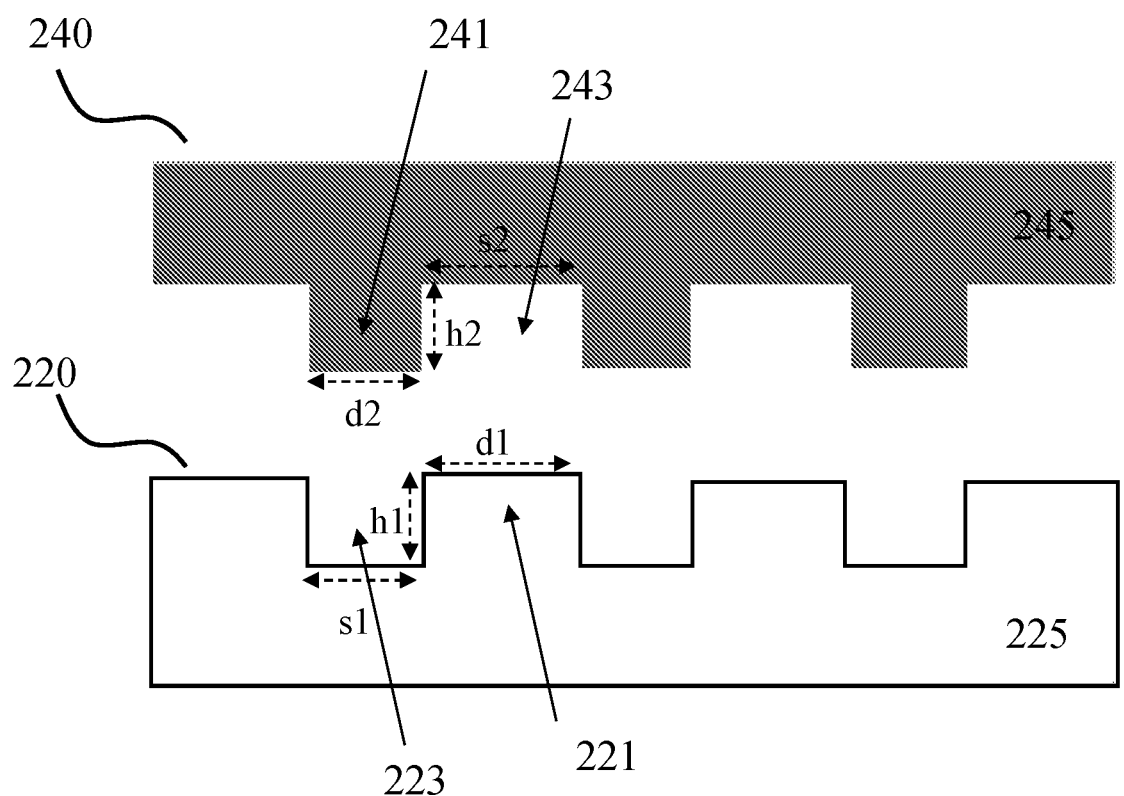

In a first aspect, a process for plasmonic-based high resolution color printing is provided.

As used herein, the term "plasmonic" or "plasmonic-based" may mean or refer to use of incident wave, such as light, of a particular frequency or wavelength range to cause excitation of free electrons in the metal surface being irradiated upon, which may cause a drop in reflectivity of the metal as energy of the incident wave is coupled into plasmon modes instead of being reflected by the metal. A certain range of wavelengths of light in the visible range may be absorbed by the metal surface to allow observation of color(s) reflected from the metal surface. The plasmon modes may include surface plasmon modes which propagate along the surface of the metal or bulk plasmon modes which propagate within the metal.

Advantageously, the process disclosed herein provides for a broad range of colors using economical, scalable approaches for metal deposition. Expensive equipment or processing under vacuum conditions required in state of the art methods is not required. This provides a significant reduction in cost and time needed to fabricate color images by plasmonic-based printing, further in view that cheap and/or earth abundant materials such as aluminum may be used. Instead of coating a substrate and nanoposts with metal using vacuum-based evaporative deposition techniques, solid metal nanoposts may be mass produced and a continuous metal film comprising nanopost structures may be generated, rendering easier adoption of processes in industry.

Plasmonic resonances may be achieved on continuous metal films to achieve a broad range of colors, even in extreme cases where the metal films are thick and opaque. In embodiments disclosed herein, nano-textured surfaces on a bulk piece of metal patterned with nanostructures comprising nanoposts and/or nanopits are able to exhibit color. A range of different colors in color images may be determined solely by patterning to form an array of nanostructures and with a single color-producing material in the form of a continuous metal film.

The color image formed using methods disclosed herein is observable based on the reflection of light from the nanostructures, in a similar way of viewing a photograph by way of reflection of light from the photograph. Excitation of the plasmonic resonances from the nanometallic structures may manifest as arrays of different colors which are visible in bright-field microscopy.

The process includes providing a nanostructured substrate surface having a reverse structure geometry comprised of nanopits and nanoposts on a support, and forming a conformal continuous metal coating over the nanostructured substrate surface to generate a continuous metal film. The continuous metal film defines nanostructures for the plasmonic-based high resolution color printing, wherein a periodicity of the nanostructures is equal to or less than a diffraction limit of visible light.

The term "nanostructure" as used herein may have a size in at least one dimension in the nanometer (nm) range, for example, a range between 1 nm and 500 nm, e.g. a range between 1 nm and 200 nm, a range between 1 nm and 100 nm, a range between 10 nm and 100 nm, or a range between 50 nm and 100 nm.

In various embodiments, the nanostructures are in the form of nanopits and nanoposts on a support.

The term "nanopost" may include a reference to a nanocolumn, a nanotube, a nanopillar or the like, and may refer to an elongate structure that extends from a surface of the support and having a size, such as height and/or diameter, in the nanometer (nm) range. Each nanopost may be a nanostructure with a columniform shape.

The term "nanopit" may include a reference to a nanohole or the like, and refers to a pit having a size, such as depth and/or diameter, in at least one dimension in the nanometer (nm) range.

The nanostructured substrate surface has a reverse structure geometry comprised of nanopits and nanoposts on a support. As used herein, the term "reverse structure geometry" refers to the nanostructured substrate surface having features which are in reverse, or opposed, to the features to be formed on the continuous metal film. In this regard, the nanostructured substrate surface may function like a mold. By forming a conformal continuous metal coating over the nanostructured substrate surface to generate a continuous metal film, the metal coating may fill in the nanopits on the support. In so doing, nanopits on the support translates into nanoposts on the continuous metal film. Nanoposts on the support, on the other hand, translate into nanopits on the continuous metal film.

The support may comprise or consist of a material selected from the group consisting of a polymer, a metal, a metalloid, and combinations thereof. In some embodiments, the support comprises or consists of a polymer. For example, the polymer may be polycarbonate, biaxially oriented polypropylene, combinations thereof, or copolymers thereof.

Providing the nanostructured substrate surface may comprise patterning the support by any suitable method, such as a method selected from the group consisting of nanoimprint lithography, electron beam lithography, photolithography, and combinations thereof. Other methods that are able to form the nanostructured substrate surface, though not explicitly stated herein, may also be used. In specific embodiments, providing the nanostructured substrate surface comprises patterning the support by nanoimprint lithography.

The process includes forming a conformal continuous metal coating over the nanostructured substrate surface to generate a continuous metal film. Generally, any method that is able to form the conformal continuous metal coating, which may be carried out under non-vacuum conditions such as ambient conditions, may be used. In some embodiments, forming the conformal continuous metal coating is carried out by a method selected from the group consisting of vapor deposition, sputtering, casting, coating, electroplating, and combinations thereof.

The continuous metal film may comprise or consist of a metal such as gold, silver, copper, and/or aluminum.

In some embodiments, the continuous metal film comprises or consists of aluminum. Advantageously, aluminum is earth abundant hence presents a cheaper option as compared to plasmonic color printing materials such as gold and silver.

The process may further include separating the continuous metal film from the nanostructured substrate surface. This may be carried out, for example, by lifting off or peeling the continuous metal film from the nanostructured substrate. In embodiments where the support is at least substantially transparent to visible light or is optically transmissive, such as in the case of polycarbonate, the support may not need to be separated from the continuous metal film, since it may not hinder irradiation of light onto the continuous metal film and/or observation of the color(s) reflected from the plasmonic nanostructures on the continuous metal film.

The continuous metal film defines nanostructures for the plasmonic-based high resolution color printing. As mentioned above, the nanostructured substrate surface may function like a mold, so that patterns present on the nanostructured substrate surface may be transferred to the continuous metal film. For example, in conformally depositing a continuous metal coating over the nanostructured substrate surface to generate a continuous metal film, the metal coating may fill in the nanopits on the support. In so doing, nanopits on the support translates into nanoposts on the continuous metal film. Nanoposts on the support, on the other hand, translate into nanopits on the continuous metal film. The continuous metal film may thus comprise nanostructures having topography or patterns which are in reverse to the features on the nanostructured substrate surface. Dimensions of nanoposts and nanopits on the nanostructured substrate surface may be tailored or adapted to obtain nanostructures of specific dimensions on the continuous metal film for plasmonic-based high resolution color printing.

In various embodiments, the nanostructures on the continuous metal film comprise nanopits and nanorods, which are in reverse structure geometry to the nanostructured substrate surface.

The nanostructures on the continuous metal film may be arranged at least substantially vertically or perpendicularly to a surface of the continuous metal film. However, it should be appreciated that any one or more or all of the spaced apart nanoposts may be arranged slightly angled to the surface, for example about 1° to 10° from an axis defined perpendicularly to the surface.

The nanostructures on the continuous metal film may have an aspect ratio greater than 0.25. The term "aspect ratio" as applied to a nanostructure may mean a ratio of the length (or height or depth) to the width (or cross sectional dimension) of the nanostructure. The length-to-width aspect ratio of the nanostructure represents the proportional relationship between its length and its width.

For example, the nanostructures on the continuous metal film may have an aspect ratio between 0.25 and 2, between 0.25 and 1.5, between 0.25 and 1, between 0.25 and 0.5, between 0.5 and 2, between 1 and 2, or between 1.5 and 2, for example an aspect ratio of 0.25 where the length of the nanostructure is a quarter of the dimension of its width, an aspect ratio of 1 where the length of the nanostructure is the same as its width, or an aspect ratio of 2 where the length of the nanostructure is twice as much compared to its width.

In various embodiments, each nanostructure may have an aspect ratio greater than 1, with a length/height/depth that is larger than a width (e.g. a cross sectional dimension) of the nanostructure, i.e. the nanostructure has a dimension in the longitudinal axis of the nanostructure that is larger than a dimension in the transverse axis (perpendicular to the longitudinal axis) of the nanostructure. Therefore, the nanostructure may be very long in length or height while being very short in diameter or width.

Height of each nanostructure may refer to a maximal distance of the nanostructure as measured from a base of the nanostructure to its tip. For example, height of nanoposts on the continuous metal film may be measured from base of the nanopost to its tip. In various embodiments, height of a nanopost on the continuous metal film corresponds to depth of an adjacent nanopit on the continuous metal film.

Height of each nanostructure may be 200 nm or less, such as in the range of about 10 nm to about 200 nm, about 50 nm to about 200 nm, about 100 nm to about 200 nm, about 150 nm to about 200 nm, about 50 nm to about 150 nm, about 100 nm to about 150 nm, about 80 nm to about 120 nm, or about 90 nm to about 170 nm. In some embodiments, height of each nanostructure is in the range of about 100 nm to about 200 nm.

Each nanostructure may have a cross sectional dimension in the range of about 10 nm to about 250 nm. The term "cross sectional dimension" may mean a dimension of a cross section of the nanostructure defined along a transverse axis (perpendicular to the longitudinal axis) of the nanostructure.

For example, each nanostructure may have a cross sectional dimension in the range of about 10 nm to about 200 nm, about 10 nm to about 100 nm, about 10 nm to about 50 nm, about 100 nm to about 250 nm, or about 50 nm to about 200 nm.

The nanostructures may have different cross sectional dimensions. In other words, each or some of the nanostructures may have a different cross sectional dimension compared to other nanostructures. For example, some nanostructures may have a cross sectional dimension, d1, while some other nanostructures may have a different cross sectional dimension, d2. Furthermore, a cluster of nanostructures at one area/region of the support may have a cross sectional dimension that is different from another cluster of nanostructures at another area/region of the support. The cross sectional dimensions of the nanostructures may depend on the color(s) that is to be produced.

Each nanostructure may have a cross sectional shape that is a square, a rectangle, a circle, an ellipse, a triangle, a hexagon, or an octagon, a polygon, to name only a few. The term "cross sectional shape" may mean a shape of a cross section of the nanostructure defined along a transverse axis (perpendicular to the longitudinal axis) of the nanostructure.

In various embodiments, the nanostructures may have different cross sectional shapes. In other words, each or some of the nanostructures may have a different cross sectional shape compared to other nanostructures. For example, some nanostructures may have a circular cross sectional shape, while some other nanostructures may have a triangular cross sectional shape. Furthermore, a cluster of nanostructures at one area/region of the support may have a cross sectional shape that is different from another cluster of nanostructures at another area/region of the support. The cross sectional shapes of the plurality of nanostructures may depend on the color(s) that is to be produced.

Two adjacent (or neighbor) nanostructures may be spaced apart by a distance or spacing or gap, s, of between about 20 nm and about 300 nm, e.g. between about 20 nm and about 200 nm, between about 20 nm and about 100 nm, between about 20 nm and about 50 nm, between about 50 nm and about 300 nm, or between about 100 nm and about 200 nm, for example a spacing of about 20 nm, about 50 nm, about 100 nm or about 200 nm.

In various embodiments, adjacent nanostructures may be spaced apart by different distances, s, thereby changing the areal densities of the nanostructures on the continuous metal film. In the context of various embodiments, the term "areal density" may refer to the density or population or number of nanostructures at a particular area of the substrate. In other words, some adjacent nanostructures may have a different spacing, s, and therefore also the pitch, p, compared to other adjacent nanostructures.

For example, some adjacent nanostructures may have a spacing, s1, or pitch, p1, while some other adjacent nanostructures may have a different spacing, s2, or pitch, p2. Furthermore, a cluster of adjacent nanostructures at one area/region of the continuous metal film may have a spacing or a pitch, and therefore also an areal density of nanostructures, that is different from another cluster of adjacent nanostructures at another area/region of the continuous metal film. The spacings or pitches of the plurality of nanostructures, and therefore also the areal densities of the nanostructures on the continuous metal film, may depend on the color(s) and/or the intensity of the color(s) that is to be produced.

As used herein, the terms "pitch" and "periodicity" are used interchangeably, and refer to the distance between the respective centres of adjacent nanostructures. The pitch, p, may be defined as (d+s), where d is the cross sectional dimension of a nanostructures, and s is the distance or spacing between two adjacent (or neighbor) nanostructures.

The periodicity of the nanostructures on the continuous metal film is equal to or less than a diffraction limit of visible light. As used herein, the term "diffraction limit" refers to Abbe's classical diffraction limit, which states that the minimum resolvable distance between two closely spaced objects is at best half the wavelength used for imaging. Hence, in various embodiments where wavelength of 1000 nm is used, a diffraction limit of visible light as used herein may refer to a distance or pitch of 500 nm between two objects. In some embodiments, 500 nm is taken as the mid-spectrum wavelength for visible light, therefore, a diffraction limit of visible light as used herein may refer to a distance or pitch of 250 nm between two objects.

In various embodiments, the periodicity is 500 nm or less. For example, the periodicity may be in the range of about 5 nm to about 500 nm, such as about 50 nm to about 500 nm, about 100 nm to about 500 nm, about 200 nm to about 500 nm, about 300 nm to about 500 nm, about 5 nm to about 350 nm, about 5 nm to about 250 nm, about 5 nm to about 150 nm, about 50 nm to about 300 nm, or about 100 nm to about 200 nm.

In some embodiments, the periodicity is 250 nm or less. For example, the periodicity may be in the range of about 5 nm to about 250 nm, such as about 5 nm to about 200 nm, about 5 nm to about 150 nm, about 5 nm to about 100 nm, about 5 nm to about 50 nm, about 25 nm to about 250 nm, about 50 nm to about 250 nm, about 100 nm to about 250 nm, about 150 nm to about 250 nm, about 200 nm to about 250 nm, about 50 nm to about 200 nm, about 100 nm to about 200 nm, about 80 nm to about 180 nm, or about 120 nm to about 220 nm.

Adjacent nanostructures may be spaced apart by a distance, s, which is at least substantially the same. Accordingly, the pitch or periodicity, p, may be at least substantially the same.

Variation in colors may be obtained by tuning plasmonic resonances of the nanostructures by changing size and/or shape of the nanostructures. When the nanostructures are irradiated with light, these plasmonic resonances determine the color(s) of light that is absorbed by the nanostructures, thereby allowing a range of different colors to be reflected and hence observable.

In various embodiments, nanostructures such as nanoposts are used for color generation. Variety of colors that may be observed may be controlled by varying the cross sectional dimension/size and the cross sectional shape of the nanoposts, as well as the pitch between adjacent nanoposts, for example, so as to vary the wavelength of light that is absorbed by the nanostructures. Therefore, an exposure layout of a pattern corresponding to the arrays of nanoposts may be designed in order to produce a significantly miniaturized colored photo/image of an original image.

The color image of various embodiments may be made up of a plurality of pixels, where each pixel may be defined either by a single structure (e.g. including one or more filters) or a cluster of structures for displaying red, green and blue colors (RGB). Each structure may be termed as "plixel" (a combination of the words "plasmonic" and "pixel"), and made up of a plurality of plasmonic nanostructures. Using methods disclosed herein, high resolution color printing of up to about $10^5$ dpi may be achieved. This resolution may be varied by controlling size of each plixel. For example, the resolution may be further increased by reducing size of each plixel.

Within each pixel area, the plurality of nanostructures or nanoposts may be positioned in a regular or uniform arrangement, or may be positioned randomly but maintaining the spacing, s, between adjacent nanostructures at approximately equal distance.

The color image may be observable using a bright-field illumination. In various embodiments, bright-field color prints or images with resolutions up to the optical diffraction limit may be obtained. Color information may be encoded in the dimensional parameters and positions of nanostructures, so that tuning of the plasmonic resonance of the nanostructures may determine the colors of the individual pixels. In embodiments where the patterned area is sufficiently large, such as greater than 100 μm×100 μm, the colors may be visible to the naked eye.

In the context of various embodiments, the cross sectional dimension, and/or the cross sectional shape of a nanostructure, and/or the spacing (or pitch) of adjacent nanostructures, and/or the material of the continuous metal film, and therefore also of the plasmonic nanostructures, may be changed depending on the color(s) to be produced. In other words, the color(s) that is produced or reflected by a plasmonic nanostructure may correspond to its cross sectional dimension and/or its cross sectional shape and/or its distance from another plasmonic nanostructure and/or the material of the plasmonic nanostructure or a combination of any two, three or all of these features.

In addition to achieving high resolution, the use of plasmonic resonators or nanostructures may also provide secondary degrees of freedom to color creation, including polarization dependence. Further improvements in resolution and color perception may be achieved by using different geometries and/or smaller numbers of plasmonic nanostructures per pixel area.

Various embodiments refer in a second aspect to a nanostructured metal film or metal-film coated support obtained by a process according to the first aspect.

As mentioned above, the process according to the first aspect may include separating the continuous metal film from the nanostructured substrate surface, which may be carried out by lifting off or peeling the continuous metal film from the nanostructured substrate, for example. Hence, the continuous metal film may be separated from the nanostructured substrate surface to obtain the nanostructured metal film.

Otherwise, the continuous metal film may remain on the nanostructured substrate surface to form a metal-film coated support. As mentioned above, the continuous metal film may not need to be separated from the nanostructured substrate surface, if the support is at least substantially transparent to visible light or is optically transmissive.

Various embodiments refer in a third aspect to a method for generating a color image. The method comprises irradiating the nanostructured metal film or metal-film coated support obtained by a process according to the first aspect with visible light.

When the nanostructures are irradiated with light, plasmonic resonances generated by the nanostructures on the nanostructured metal film or metal-film coated support may determine the color(s) of light that is absorbed by the nanostructures, thereby allowing a range of different colors to be reflected and hence observable.

Various embodiments refer in a fourth aspect to use of a method according to the third aspect in security tagging, anti-counterfeiting, display, and/or data-storage.

The approach or color-mapping technique of the various embodiments may be applied to create a full-color image or micro-image with high levels of details, with both sharp color changes and fine tonal variations.

As the images are of high resolutions, the images cannot be printed with existing color printers, which have a resolution limit of about 10,000 dpi (dots per inch). In contrast, the color micro-photography technique of various embodiments may produce a pixel density as high as about 100,000 dpi, for example where the individual color elements (or pixels) have a pitch of about 250 nm. Therefore, the technique of various embodiments enable the printing of color micro-images or micro-photographs having a resolution with more than an order of magnitude higher than state-of-the-art printers.

As a result of the high levels of details/resolutions due to the high-level of technology involved in creating the micro-image, such an image may be employed as a highly secure (e.g. anti-fraud) element on items such as smart cards/credit cards, or as security features on currency notes or coins.

Given the wide range of color tunability, plasmonics color printing technology disclosed herein is ideal for high-tech security tagging and anticounterfeiting applications, for example, in the form of anti-fraud elements on currency and smart cards/credit cards. It also has the unique capacity to engineer high-resolution color pixels which encode multiple layers of optical information within the same area of volume. Use of plasmonic resonances has added advantage that the plasmonic colors do not degrade over time.

Besides the above-mentioned applications, the micro-images produced may be used for steganography, nanoscale optical filters and high-density spectrally encoded optical data storage.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

As used herein, the term "and/or" includes any and all combinations of one or more of the associated listed items. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The invention illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

EXPERIMENTAL SECTION

Figure 3:
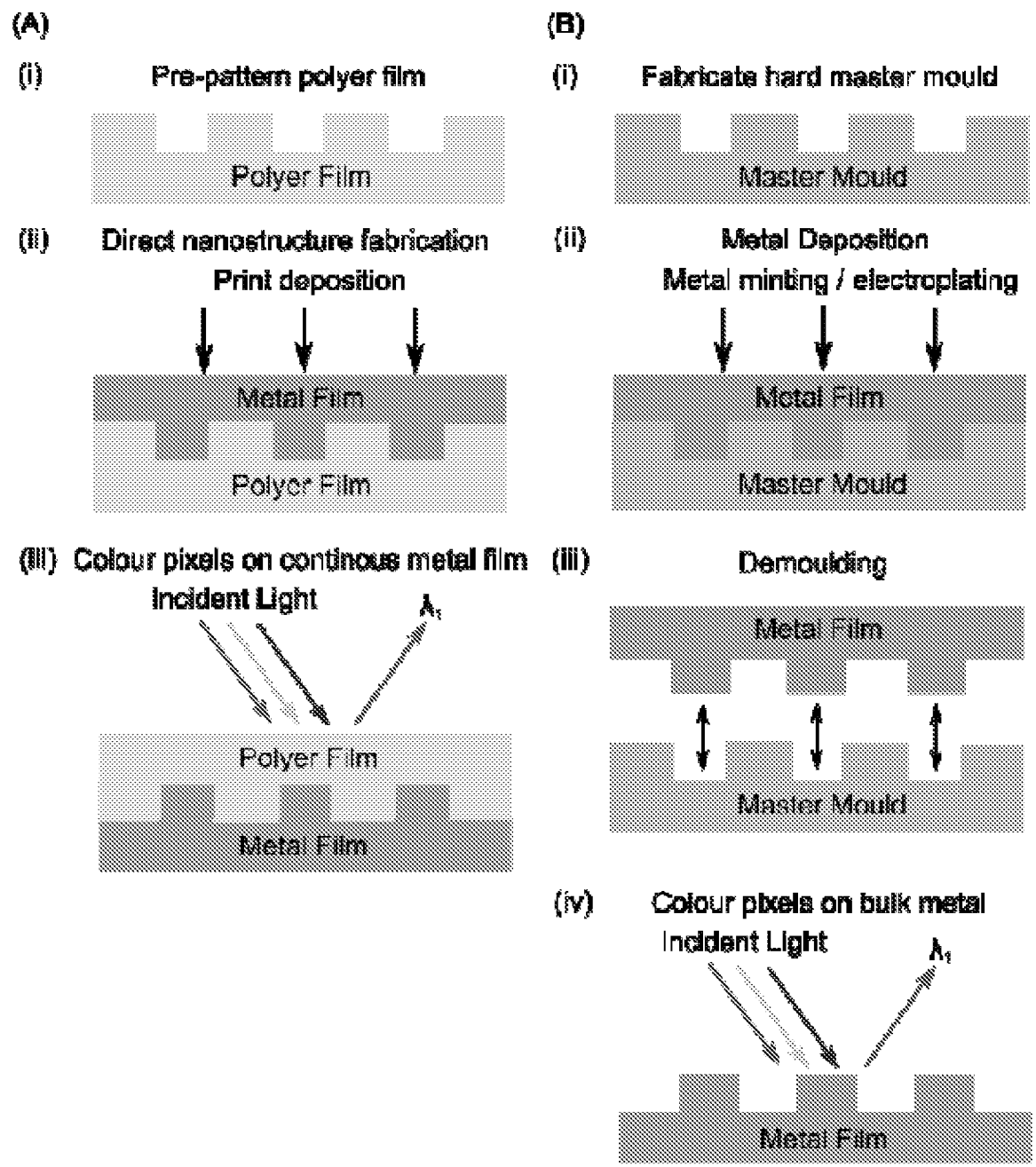
FIG. 3 shows designs for high-resolution plasmonic color printing on solid metal films and surfaces, where (A) shows metal nanostructures formed on an optically opaque metal film and coated with a polymer film; and (B) shows bulk metal substrate patterned with nanostructures. In (A), a pre-patterned polymer film may be fabricated using patterning techniques such as nanoimprint lithography as shown in (i). Next, a continuous metal film may be formed on the patterned polymer surface by print deposition as shown in (ii). This may be followed by an annealing step, to yield the nanostructure illustrated in FIG. 3(A)(iii)—an optically opaque metal film patterned with either nanopits or nanoposts and coated with a polymer film. Light may be irradiated on the nanostructured metal film through the polymer film to generate a color image. This particular approach may be envisioned for application in plastic notes currency. In (B), a hard master mould may first be fabricated using suitable patterning methods such as electron beam lithography (EBL) as shown in (i). Subsequently, minting of a metal surface or deposition of additional metals onto the metal surface by means of electroplating may be carried out to achieve a bulk state of metal as shown in (ii). Finally, the nanostructure comprising a bulk metal substrate patterned with either nanopits or nanoposts may be de-molded or separated from the mold as shown in (iii). Light may be irradiated on the metal film to generate a color image as shown in (iv). This approach may find application in coin currency.

An approach for fabricating plasmonic color pixel and design for plasmonic color pixels based on continuous instead of isolated nanostructures are disclosed herein. There may be two approaches towards achieving this: (1) by depositing a conformal metal coating over a pre-patterned surface, or (2) by patterning continuous metal structures on a solid, optically thick metal substrate, such as that shown in FIG. 3.

This approach uses continuous nanostructures instead of isolated nanostructures as the basic element to form a printed color image. These new types of pixels allows color imaging to be achieved either through a thick conformal metal coating on a pre-patterned surface, or by directly patterning on a solid, optically thick piece of metal. Using methods disclosed herein, color images at the optical diffraction limit may be printed directly onto metal surfaces, such as coins and other metal finishes, as well as provide a cost-effective and economically feasible process for depositing metal onto plastic films, for example, for application towards printing of plastic notes currency.

Advantageously, only a single plasmonic metal is required, thus reducing the need for extra fabrication steps. As compared to state of the art plasmonic-based printing methods, dielectric spacers for isolating the resonances generated in the isolated nanostructures are not required. This is surprising because initial experiments suggested that no color was generated when disks were placed directly on a reflective non-metallic surface (e.g. silicon) without using a dielectric, in an array of short nanopillars and shallow nanopits on a metal surface. As such, it is counter-intuitive that a spectrum of different colors may be achieved using continuous nanostructures rather than isolated metal nanostructures. Since bulk metals as well as conformal metal surfaces may be used, this bypasses the need for fine control of thin metal film deposition as well as vacuum-based metal deposition processes.

As disclosed herein, various embodiments relate to an all-metal, optically thick film having nanopits and protrusions of dimensions about 100 nm to about 200 nm and a pitch of 250 nm, which are well below the diffraction limit, and which is adapted to provide high-resolution colors.

Proof-of-concept for generating a color palette using the processes described above has been demonstrated. For a structure closely resembling Design A shown in FIG. 3, Finite-difference time-domain (FDTD) simulations were performed using Lumerical (Lumerical FDTD solution. http://www.lumerical.com/) with the optical properties of aluminum based on data from Palik (Palik, E. D. *Handbook of Optical Constants of Solids, Vol.* 1, 804 (Academic Press, 1985).

Figure 4:
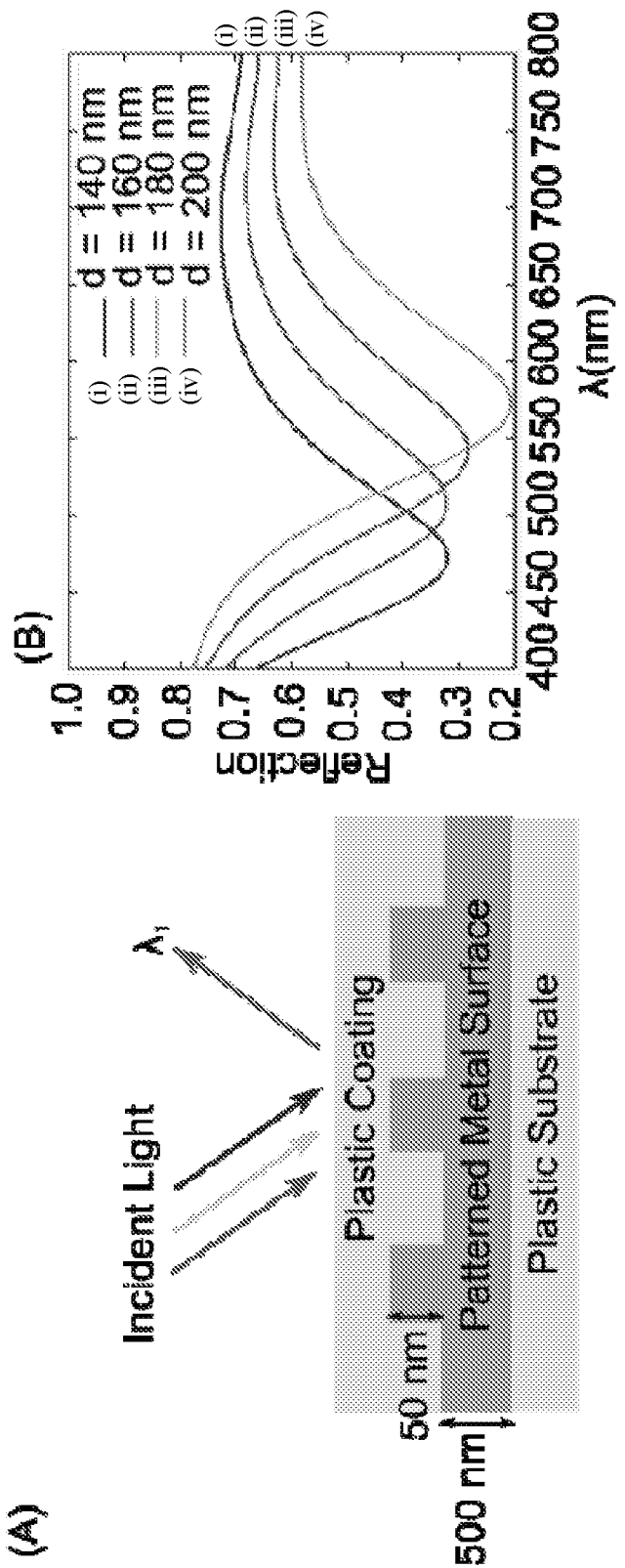
FIG. 4 shows preliminary investigations on nanodisk structures formed on a continuous aluminum layer, where (A) is a schematic diagram of aluminum nanodisk structures formed on an optically thick aluminum layer and coated with a polymer; and (B) is a graph showing simulated reflection spectra of aluminum nanodisk structures, for (i) d=140 nm; (ii) d=160 nm; (iii) d=180 nm; and (iv) d=200 nm.

The simulation model was built off the schematic shown in FIG. 4(A). Arrays of 50 nm tall aluminum nanopillars formed on a 500 nm thick aluminum layer (which is equivalent optically to a bulk aluminum substrate) were simulated. The dimensions of the nanopillar spanned from 140 nm to 200 nm, with each pillar spaced 250 nm away from the adjacent pillar. Geometry of the nanostructure studied here is similar to Design A shown in FIG. 3(A), which comprises an optically opaque metal film patterned with either nanopits or nanoposts and coated with a polymer film. The simulated reflectance spectra plots for the nanostructures are given in FIG. 4(B). Clearly, a spectrum of different colors may be achieved through variation of the nanostructure diameter spaced a constant distance apart (250 nm). These simulations hence indicate the feasibility of engineering plasmonic color pixels using metal nanostructures formed on an optically opaque slab of metal. Subsequent steps would be to fabricate these new types of plasmonic pixels and generate a color image by modifying a software code to create a layout for the electron-beam lithography system.

For Design B illustrated in FIG. 3(B), for the case when the master mould approaches to the nanometric length-scale, it is possible to form nanoscale grooves using different geometric shapes fabricated on the metal surface. Here, gap plasmon modes may be excited within the nanoscale groove region, resulting in a dip in the reflectance spectrum. This dip corresponds to a specific color in the visible spectrum and which, may be viewed plainly under an optical microscope.

Figure 5:
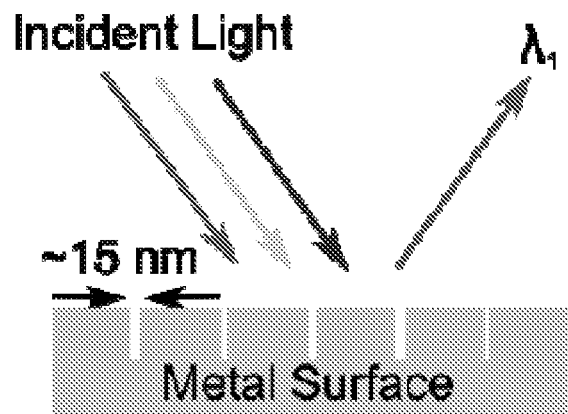
FIG. 5 shows preliminary results on nanoscale groove gold surfaces for gap plasmon-based color printing, where (A) is schematic diagram of nanoscale groove gold surfaces; (B) are optical microscope image of fabricated square, hexagonal, and triangular grooves; (C) to (E) are scanning electron microscopy images of fabricated (C) square, (D) hexagonal, and (E) triangular grooves on a gold surface; (F) is a graph showing measured relative reflectance spectrum for the respective grooves; and (G) is a graph showing simulated reflectance spectrum for rectangular grooves with gaps varying from 9 nm to 17 nm. Scale bars: (B) 200 µm; (C) to (E) 500 nm.
Figure 5:
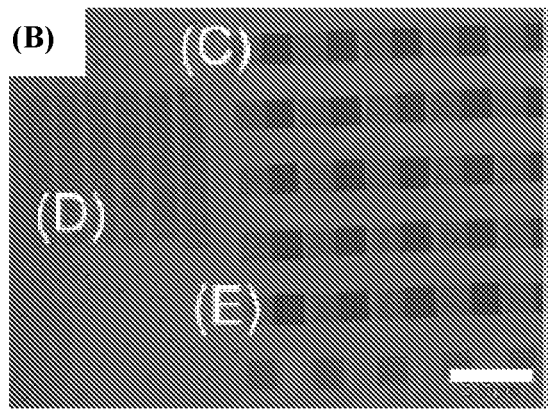
Figure 5:
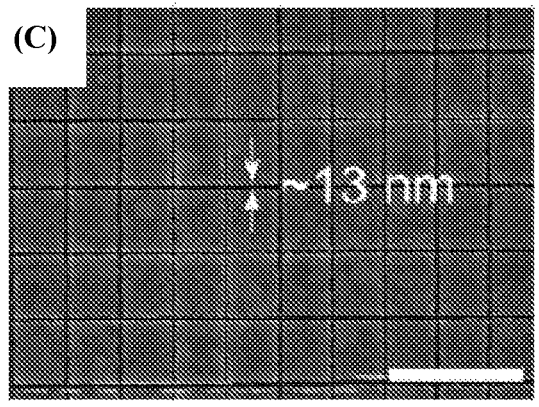
Figure 5:
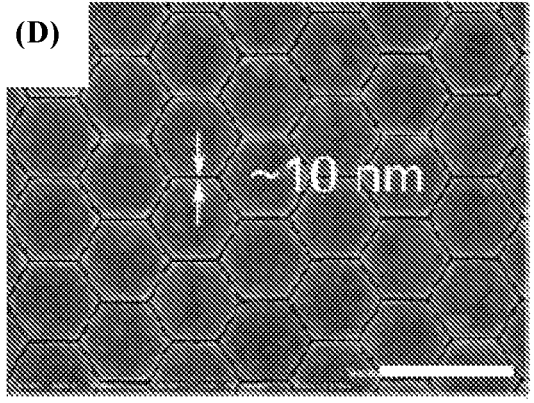
Figure 5:
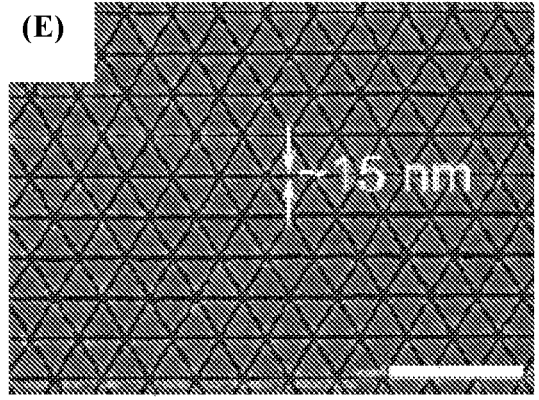
Figure 5:
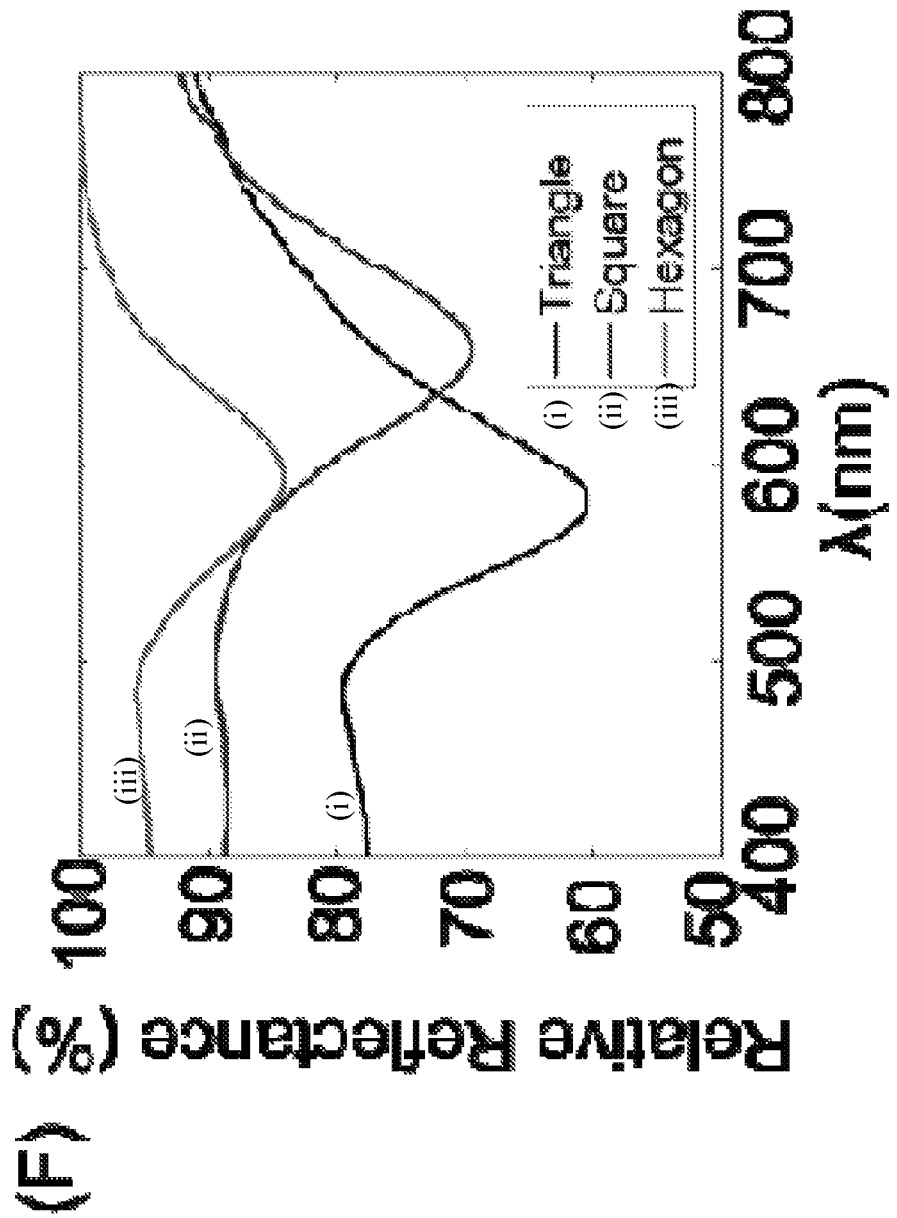
Figure 5:
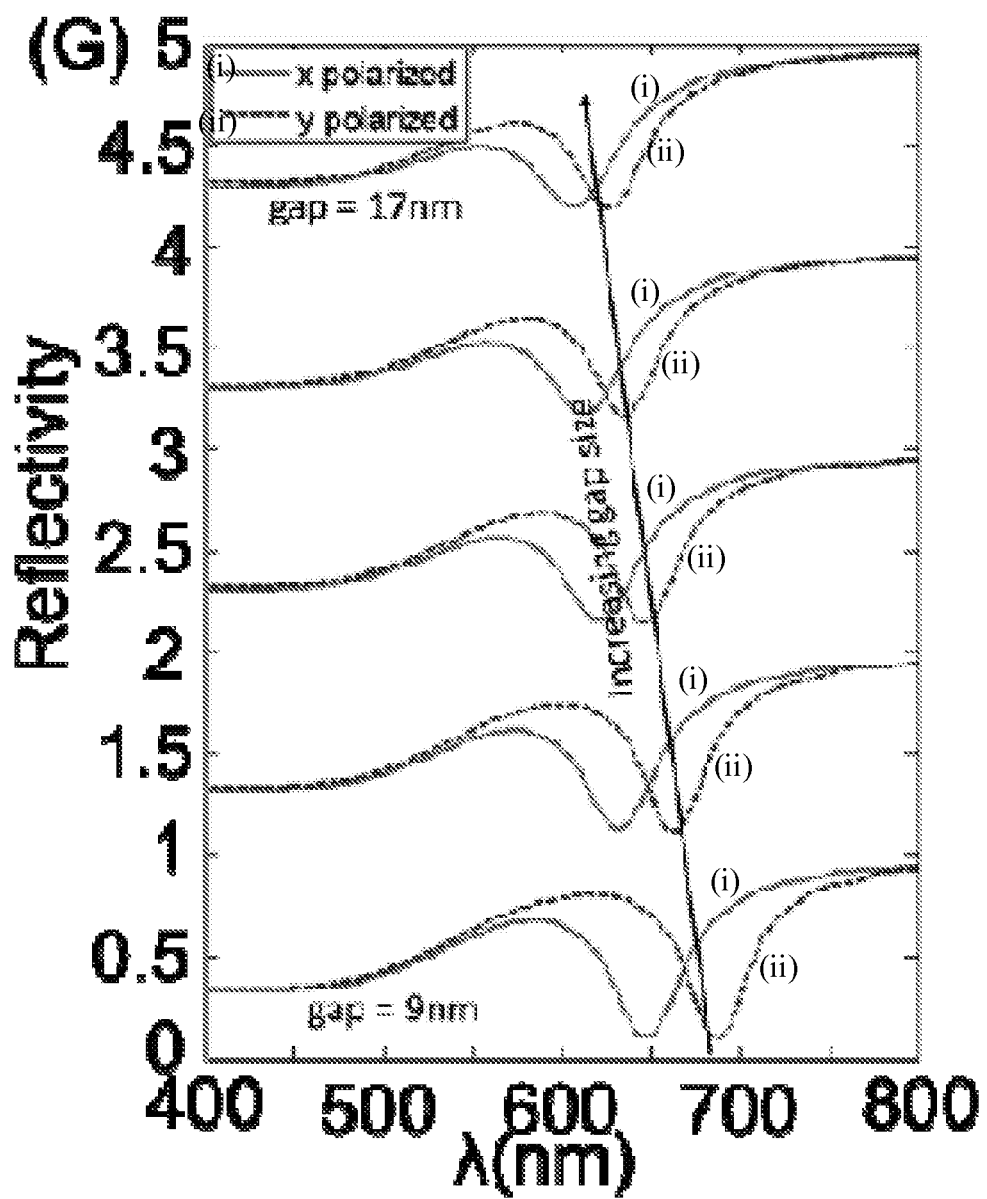
Figure 6:
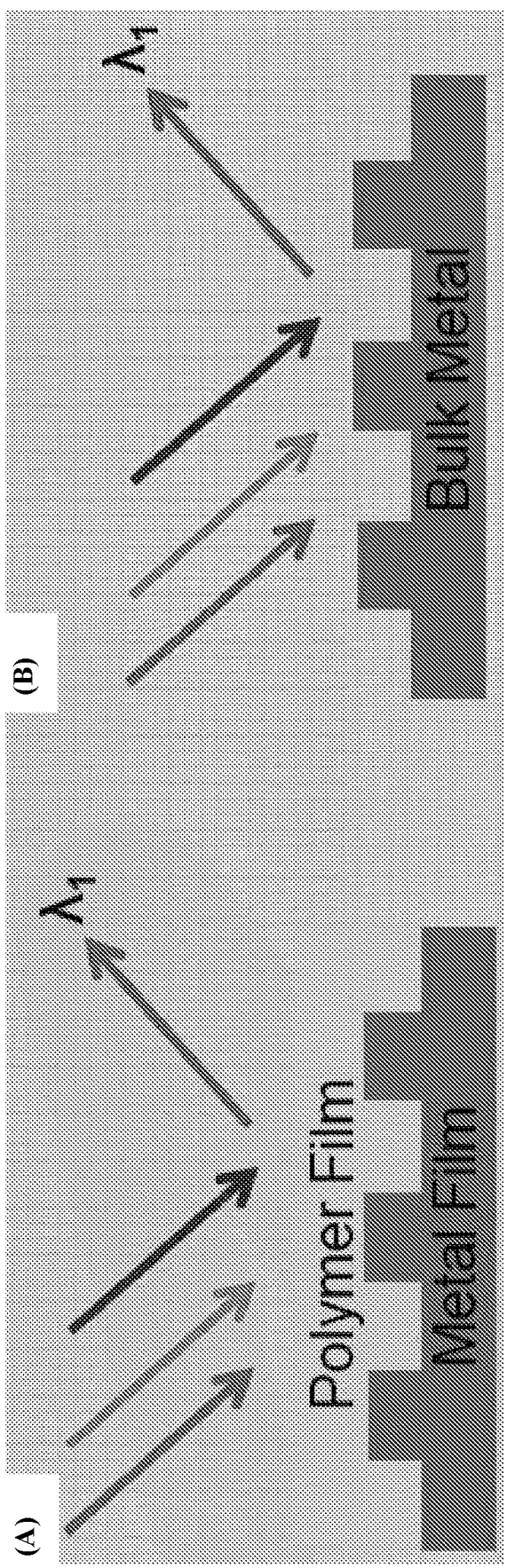
FIG. 6 depicts schematic diagrams showing (A) irradiation of light on metal nanostructures formed on an optically opaque metal film and coated with a polymer film according to embodiments; and (B) irradiation of light on metal nanostructures formed on an optically opaque metal film according to embodiments.

Preliminary experimental results showing the colors obtained from nanoscale square, hexagonal and triangular grooves fabricated on a gold-coated surface are presented in FIG. 5(B). Corresponding scanning electron microscope images of the fabricated nanostructures shown in FIG. 5(c) to (E) indicate the typical groove size ranging from 10 nm to 15 nm. When a broadband light is incident on the sample surface, a gap plasmon mode will be excited at its resonance wavelength with its energy confined within the gap. Accordingly, this excitation will induce a dip in the reflectance spectrum as shown in FIG. 5(F). The dip in the reflectance spectrum, and therefore, the color exhibited by each pixel may be tuned simply by changing the gap size. This is verified by Finite-difference time-domain (FDTD) simulations using Lumerical as shown in the reflectance spectrum for rectangular grooves with gaps varying from 9 nm to 17 nm in FIG. 5(F). As such, each type of geometry used to form the nanogrooves may provide a new palette with different colors and tones.

In various embodiments, plasmon resonances from nanometallic structures composed of nanoposts or nanopits patterned with periodic structures smaller than the wavelength of light are designed and exploited as a strategy for plasmonic-based high resolution color printing.

These plasmon resonances will manifest as a full range of colors visible in bright-field microscopy. In addition, the colors, and thus images printed, may be made to be sensitive to polarisation of the incident light. Furthermore, the colors visible in darkfield microscopy may be different from that visible in bright-field. The above features provide additional layers of encryption/encoding that will find use in applications such as anticounterfeiting of currencies.

The colors exhibited in the structures as shown in FIG. 3A—metal nanostructures formed on an optically opaque metal film and coated with a polymer film may be controlled by the dimensions (eg. width, height and pitch) and geometry of the nanopost.

The colors exhibited in the structures for the case of FIG. 3B—bulk metal substrate patterned with nanostructures may be controlled by the dimensions of the nanoposts (eg. width, height and pitch), geometry of the nanopost (eg. square, triangular or hexagonal) and the size of the gaps formed between the nanostructures.

Resolution of this method (minimum color pixel size) according to various embodiments is about 250 nm, which is well below the diffraction limit. Methods disclosed herein will work with a range of other basic elements, including but not limited to the nanodisk or nanosquare geometry. For example, linear structures and an array of holes with varying density will also achieve a similar result.

This new architecture allows entire surface of the metal film to be continuous, rather than individual metal nanostructures isolated from each other by another material such as a dielectric. It may also work if a bulk piece of metal is patterned to have nanopits or grooves or nanoposts formed on its surface.

The architecture of this design fundamentally allows for large-scale cost effective production. While this method using e-beam lithography has been demonstrated, it may also work with high-resolution photolithography techniques. The method also allows for images to be reproduced in mass volume using nanoimprinting.

Methods disclosed herein may be used to create high-resolution color prints which could find use as security features on items such as smart cards/credit cards, due to the high-level of technology involved in creating the microimage. Furthermore, unlike conventional pigment-based color printing, methods disclosed herein have the capacity to engineer color pixels that can encode of multiple layers of optical information within the same area of volume. The approach for coloring metal surfaces proposed herein should also provide colors that have a wider viewing angle than diffractive methods. Such printing capabilities could find application in adding color to coins, jewellery, decorative metal finishing.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A system comprising:
   a smart card, a credit card, a currency note or a coin comprising a nanostructured metal film or metal-film coated support obtained by a process for plasmonic-based high resolution color printing, the process comprising:
   a) providing a nanostructured substrate surface having a reverse structure geometry comprised of nanopits and nanoposts on a support,
   b) forming a conformal continuous metal coating over the nanostructured substrate surface entirely to generate a continuous metal film consisting of a solid metal substrate and nanostructures on the solid metal substrate for the plasmonic-based high resolution color printing, wherein each of the nanostructures has a different cross sectional dimension and a different cross sectional shape compared to other nanostructures of the nanostructures, wherein a periodicity of the nanostructures is equal to or less than a diffraction limit of visible light, and
   c) separating the continuous metal film by peeling the continuous film formed over the nanostructured substrate surface entirely, from the nanostructured substrate surface; and
   a broadband visible light source so that plasmonic resonances generated by the nanostructures when the nanostructures are irradiated with the visible light from the broadband visible light source absorb one or more colors of light, and the nanostructures reflect different colors of light, thereby generating a color image;
   wherein the visible light is a broadband light; and
   wherein the nanostructured metal film or the metal-film coated support is a security feature on the smart card, the credit card, the currency note, or the coin.

2. The system according to claim 1, wherein the support comprises a material selected from the group consisting of a polymer, a metal, a metalloid, and combinations thereof.

3. The system according to claim 1, wherein the support is at least substantially transparent to the visible light.

4. The system according to claim 1, wherein providing the nanostructured substrate surface comprises patterning the support by a method selected from the group consisting of nanoimprint lithography, electron beam lithography, photolithography, and combinations thereof.

5. The system according to claim 1, wherein providing the nanostructured substrate surface comprises patterning the support by nanoimprint lithography.

6. The system according to claim 1, wherein forming the conformal continuous metal coating is carried out by a method selected from the group consisting of vapor deposition, sputtering, casting, coating, electroplating, and combinations thereof.

7. The system according to claim 1, wherein the periodicity is 500 nm or less.

8. The system according to claim 1, wherein the periodicity is in the range of about 5 nm to about 500 nm.

9. The system according to claim 1, wherein height of each nanostructure is 200 nm or less.

10. The system according to claim 1, wherein height of each nanostructure is in the range of about 100 nm to about 200 nm.

11. The system according to claim 1, wherein the cross sectional dimension of each nanostructure is in the range of about 10 nm to about 250 nm, the cross sectional dimension being defined along a transverse axis of the nanostructure.

12. The system according to claim 1, wherein the continuous metal film comprises a metal selected from the group consisting of gold, silver, copper, aluminum, and combinations thereof.

13. The system according to claim 1, wherein the continuous metal film comprises aluminum.

14. The system according to claim 1, wherein the color image is observable using a bright-field illumination.

* * * * *